(12) United States Patent
Harwalkar et al.

(10) Patent No.: US 10,181,868 B2
(45) Date of Patent: Jan. 15, 2019

(54) APPARATUS FOR RADIO-FREQUENCY RECEIVER WITH REDUCED POWER CONSUMPTION AND ASSOCIATED METHODS

(71) Applicant: Silicon Laboratories Inc., Austin, TX (US)

(72) Inventors: Navin Harwalkar, Austin, TX (US); Arup Mukherji, Austin, TX (US); John M. Khoury, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/609,412

(22) Filed: May 31, 2017

(65) Prior Publication Data

US 2018/0351593 A1 Dec. 6, 2018

(51) Int. Cl.
| H04B 15/00 | (2006.01) |
| H04B 1/16 | (2006.01) |
| H03H 7/01 | (2006.01) |
| H03D 7/14 | (2006.01) |
| H03F 3/189 | (2006.01) |
| H03G 1/00 | (2006.01) |

(52) U.S. Cl.
CPC .............. H04B 1/16 (2013.01); H03D 7/14 (2013.01); H03F 3/189 (2013.01); H03G 1/0005 (2013.01); H03H 7/0153 (2013.01); *H03F 2200/144* (2013.01); *H03F 2200/165* (2013.01); *H03F 2200/21* (2013.01); *H03F 2200/294* (2013.01); *H03F 2200/451* (2013.01)

(58) Field of Classification Search
CPC ............ H03H 7/0153; H03F 2200/294; H03F 2200/451; H04B 1/10; H04B 1/0475

USPC ... 455/501, 63.1, 67.13, 114.2, 277.1, 278.1, 455/334

See application file for complete search history.

(56) References Cited

U.S. PATENT DOCUMENTS

| 7,092,043 | B2 * | 8/2006 | Vorenkamp | ......... | H01F 17/0006 |
| | | | | | 257/E27.046 |
| 8,165,538 | B2 * | 4/2012 | Pullela | ................. | H03D 7/1441 |
| | | | | | 455/114.1 |
| 8,406,707 | B2 * | 3/2013 | Pullela | ................. | H03D 7/1441 |
| | | | | | 455/114.1 |
| 8,594,603 | B2 * | 11/2013 | Balankutty | .............. | H04B 1/12 |
| | | | | | 455/278.1 |

(Continued)

OTHER PUBLICATIONS

Nguyen et al., A Low-Power RF Direct-Conversion Receiver/Transmitter for 2.4-GHz-Band IEEE 802.15.4 Standard in 0.18-μm CMOS Technology, IEEE Transactions on Microwave Theory and Techniques, vol. 54, No. 12, Dec. 2006, 10 pp.

(Continued)

*Primary Examiner* — Sonny Trinh
(74) *Attorney, Agent, or Firm* — Law Offices of Maximilian R. Peterson

(57) ABSTRACT

An apparatus includes a radio-frequency (RF) receiver. The RF receiver includes a single-balanced passive mixer driven by the output of a low noise amplifier (LNA) and a passive filter driven by an output of the single-balanced passive mixer. The RF receiver further includes a programmable gain amplifier (PGA) having an input resistance that generates noise, where the PGA is driven by an output of the passive filter, and the noise generated by the input resistance of the PGA is suppressed.

20 Claims, 11 Drawing Sheets

(56) References Cited

U.S. PATENT DOCUMENTS

| 9,178,549 B2 | 11/2015 | Harwalkar et al. |
| 2005/0186917 A1* | 8/2005 | Rofougaran ............ H03F 3/245 |
| | | 455/73 |
| 2008/0089445 A1* | 4/2008 | Kuo ........................ H04B 1/28 |
| | | 375/327 |

OTHER PUBLICATIONS

Kim et al., A Highly Linear SAW-Less CMOS Receiver Using a Mixer With Embedded Tx Filtering for CDMA, IEEE Journal of Solid-State Circuits, vol. 44, No. 8, Aug. 2009, 12 pp.

Giannini et al., A 2mm$^2$ 0.1-to-5GHz SDR Receiver in 45nm Digital CMOS, ISSCC 2009, 3 pp.

Franks et al., An Alternative Approach to the Realization of Network Transfer Functions: The N-Path Filter, The Bell System Technical Journal, 1321-1350, Sep. 1960, 30 pp.

Ghaffari et al., Tunable High-Q N-Path Band-Pass Filters: Modeling and Verification, IEEE Journal of Solid-State Circuits, vol. 46, No. 5, May 2011, 13 pp.

Von Grunigen et al., An Integrated CMOS Switched-Capacitor Bandpass Filter Based on N-Path and Frequency-Sampling Principles, IEEE Journal of Solid-State Circuits, vol. sc-18, No. 6, Dec. 1983, 9 pp.

\* cited by examiner

APPARATUS FOR RADIO-FREQUENCY RECEIVER WITH REDUCED POWER CONSUMPTION AND ASSOCIATED METHODS

TECHNICAL FIELD

The disclosure relates generally to communication apparatus and associated methods. More particularly, the disclosure relates to apparatus for receivers with reduced power consumption and fast overload recovery, and associated methods.

BACKGROUND

With the increasing proliferation of wireless technology, such as Wi-Fi, Bluetooth, and mobile or wireless Internet of things (IoT) devices, more devices or systems incorporate radio frequency (RF) circuitry, such as receivers and/or transmitters. To reduce the cost, size, and bill of materials, and to increase the reliability of such devices or systems, various circuits or functions have been integrated into integrated circuits (ICs). For example, ICs typically include receiver and/or transmitter circuitry. A variety of architectures and circuitry for transmitters and receivers are used. Transmitters send or transmit information via a medium, such as air or free-space, using RF signals. Receivers at another point or location receive the RF signals from the medium, and retrieve the information. Typically, transmitters transmit coded data via RF signals. Receivers receive, decode, demodulate, etc. the RF signals to retrieve the data.

Some wireless communication standards define a preamble for a wireless packet, which is a predefined data pattern that a receiver can use to detect and settle its control loops. The control loops depend on the receiver architecture, and may for example include Automatic Gain Control (AGC), Automatic Frequency Compensation (AFC), and Symbol Clock Recovery (SCR). In some standards and some architectures the AGC loop must settle relatively fast, say within a fraction of the preamble duration. In such standards and architectures it is desirable for the receiver to be capable of fast recovery from RF overload conditions. After the receiver detects the end of the preamble, the receiver is prepared to receive a full packet including payload data. Some receivers use a preamble detector to detect the arrival of a frame. In response to the preamble detector signaling the detection of the preamble, the receiver begins looking for the next portion of the frame. Digital signal processing (DSP) and demodulation (DEMOD) circuitry are typically used to demodulate and generally process the received signals.

The description in this section and any corresponding figure(s) are included as background information materials. The materials in this section should not be considered as an admission that such materials constitute prior art to the present patent application.

SUMMARY

A variety of apparatus and associated methods are contemplated according to exemplary embodiments. According to one exemplary embodiment, an apparatus includes an RF receiver. The RF receiver includes a single-balanced passive mixer driven by the output of a low noise amplifier (LNA) and a passive filter driven by an output of the single-balanced passive mixer. The RF receiver further includes a programmable gain amplifier (PGA) having an input resistance that generates noise, where the PGA is driven by an output of the passive filter, and the noise generated by the input resistance of the PGA is suppressed.

According to another exemplary embodiment, an apparatus includes an RF receiver, which includes an LNA driving a resistor coupled to an output of the LNA, and a single-balanced passive mixer driven by the output of the LNA. The RF receiver further includes a passive filter driven by an output of the single-balanced passive mixer, and a PGA having an input resistance that generates noise. The PGA driven by an output of the passive filter. The noise generated by the input resistance of the PGA is suppressed by the resistor coupled to the output of the LNA and by operation of the single-balanced passive mixer.

According to another exemplary embodiment, a method of processing RF signals includes mixing, by using a single-balanced passive mixer driven by an output of an LNA with a local oscillator (LO) signal to generate an intermediate frequency (IF) signal, and using a passive filter to filter the IF signal to generate a filtered signal. The method further includes amplifying the filtered signal by using a programmable gain amplifier (PGA) that has an input resistance that generates noise, wherein the noise generated by the input resistance of the PGA is suppressed.

BRIEF DESCRIPTION OF THE DRAWINGS

The appended drawings illustrate only exemplary embodiments and therefore should not be considered as limiting the scope of the application or the claims. Persons of ordinary skill in the art will appreciate that the disclosed concepts lend themselves to other equally effective embodiments. In the drawings, the same numeral designators used in more than one drawing denote the same, similar, or equivalent functionality, components, or blocks.

DETAILED DESCRIPTION

The disclosed concepts relate generally to RF receivers or transceivers. More specifically, the disclosed concepts provide apparatus and methods for RF receivers or transceivers with reduced power consumption, and associated methods, as described below in detail.

Figure 1:
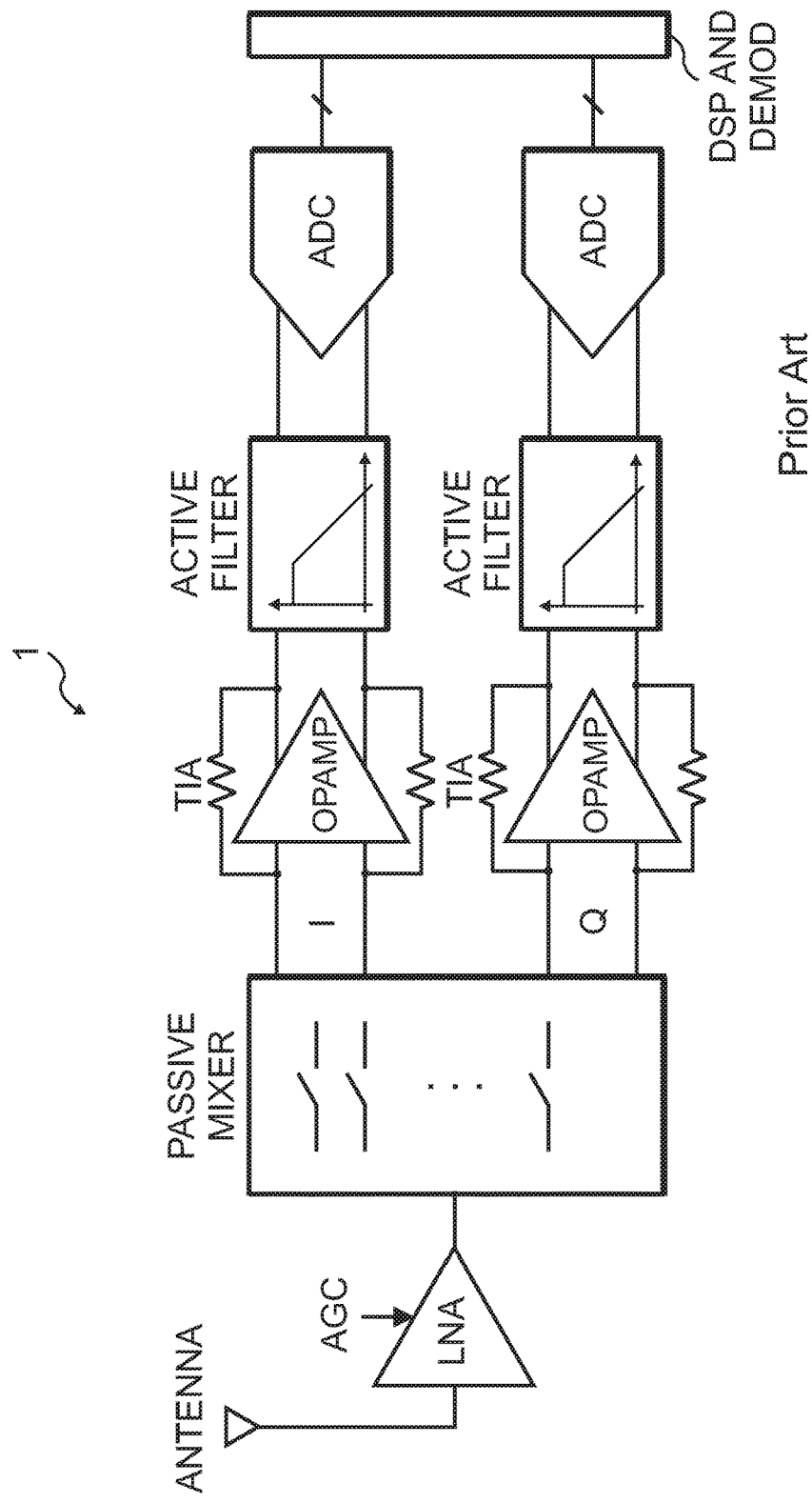
FIG. 1 illustrates a conventional RF receiver.

A variety of RF receivers are known to persons of ordinary skill in the art. FIG. 1 illustrates a conventional RF receiver 1. Receiver 1 includes a passive mixer and transimpedance amplifiers (TIAs). The low input impedance of the TIA at baseband frequencies is upconverted by the passive mixer around the LO frequency, $f_{lo}$, to create a relatively low impedance at the LNA output at RF frequencies.

This scheme helps reduce LNA output distortion because output swing is limited by the low impedance. RF distortion is still limited by the LNA input, so the passive mixer and TIA architecture does not address the problem of RF distortion in its entirety. This architecture does not protect the TIA operational amplifier (opamp or op-amp or op amp) during RF transients and overload conditions.

Large desired or blocker channels can appear and disappear suddenly. The receiver's automatic gain control (AGC) loop adapts the receiver gains to avoid saturation due to large desired or blocker channels, but the adaptation does not occur instantly. In a TIA-based receiver the entire current of the LNA (which can be relatively large due to thermal noise reasons) can flow into the TIA op-amps during an AGC transient. If the TIA op-amps are not designed to sink and source this current, their bias point will be disturbed and may not recover sufficiently quickly when the AGC backs off receiver gains. This sequence of events can create long transients in phase, frequency, and/or amplitude at the demodulator input that degrades the performance of the receiver in some applications, like Bluetooth Low Energy (BLE).

If on the other hand, the TIA is designed to sink and source relatively large currents, it increases the power consumption of the receiver. In some applications, such as Internet of things (IoT), the receiver should simultaneously be robust to RF overload and also consume relatively low power.

The TIA-based receiver in FIG. 1 also has a relatively low impedance at the TIA input. The relatively low impedance makes it impractical to create a passive filter at the mixer-TIA interface. The filter pole is typically implemented using an active filter. An active filter, compared to a passive filter, consumes more power, and typically also consume more IC area and resources.

Figure 2:
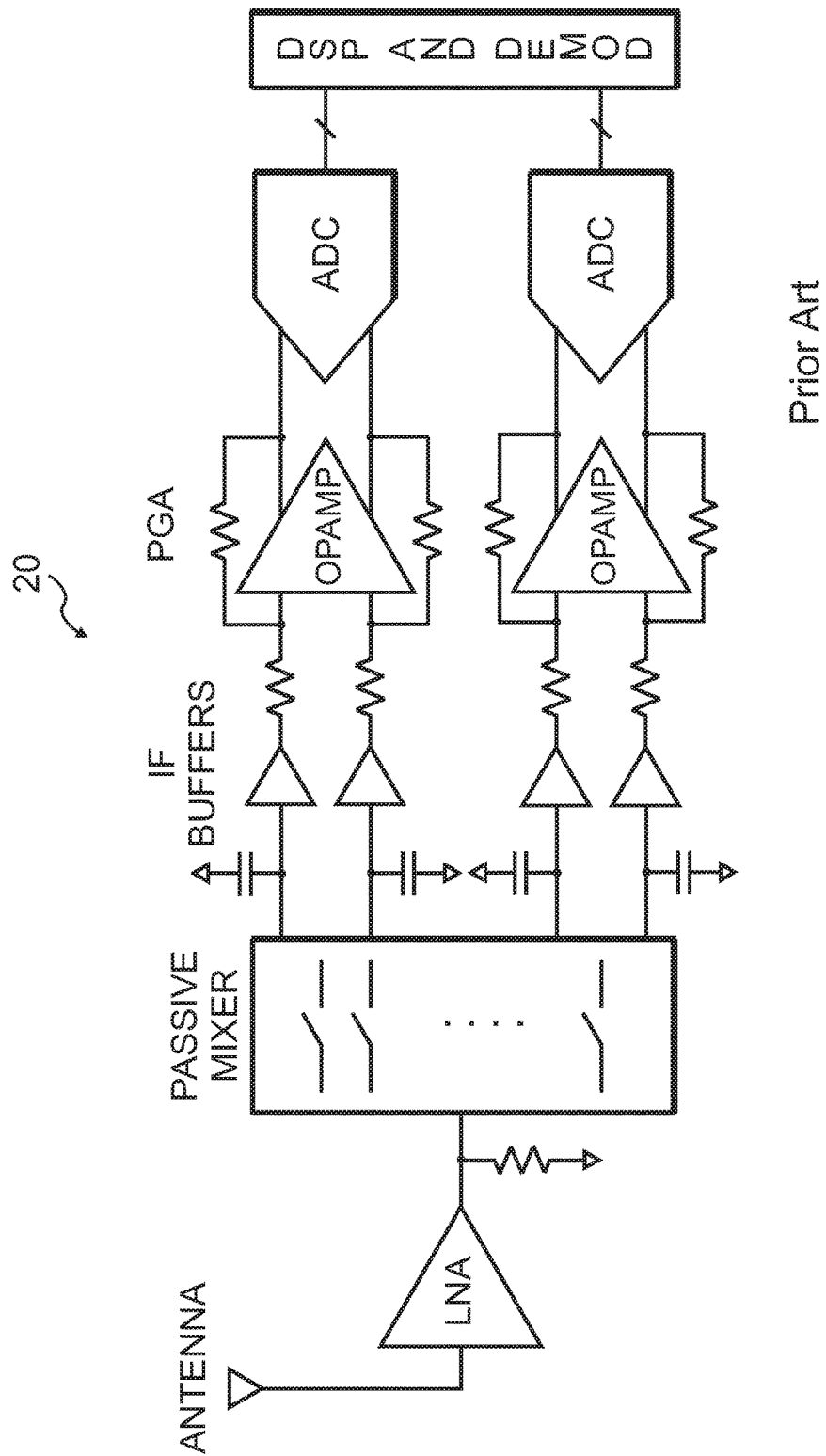
FIG. 2 depicts another conventional RF receiver.

FIG. 2 depicts another conventional RF receiver 20. Receiver 20 uses an N-path filter. N-path filters use capacitive IF impedance. IF buffers are used to keep the IF impedance purely capacitive. The buffers can be implemented in any way as long as they present a capacitive input impedance and are compatible with the output common mode level of the N-path filter.

The corner frequency of the pole at the passive mixer output is defined by the capacitance of capacitors at the output of the passive mixer and the resistance at the output of the LNA. The IF buffers feed a resistive-input PGA. The input resistors of the PGA limit the maximum current flowing to the PGA op-amps. Thus, the PGA op-amps do not have to sink or source the entire DC current of the LNA, which in turn allows the PGA op-amps to be designed with less current consumption. This arrangement in theory addresses overload and lack of passive filtering in TIA-based receivers.

The buffers that isolate the N-path mixer output from the input resistor of the PGA consume power. They also add their own thermal noise. In practice, a relatively substantial amount of power is typically allocated to these buffers to keep their thermal noise contribution low. Further, if the buffers are implemented as non-inverting unity-gain buffers (which is common, and may be implemented by connecting the output of an op-amp to its inverting input) their input common mode tracks the signal at the N-path mixer output.

This attribute imposes additional constraints on the design of the op-amp in the buffers, and makes the buffers prone to settling problems during AGC transients. More specifically, strong channels (desired or blocker) can cause relatively large swings (e.g., rail to rail) of the input common mode of the IF buffers and cause the first stage of the op-amp to shut down or operate in a switching mode. Once saturated, the buffers will take time to recover when the AGC backs off the gain to the appropriate steady-state level. Similar to conventional TIA-based receivers, this situation can create slow-settling of phase, frequency, and/or amplitude transients that are detrimental to the demodulation of signals in some applications, such as BLE.

The following disclosure describes receivers according to exemplary embodiments. Note that the figures as depicted show the front-end circuitry of the RF receivers. Details such as DSP and demodulation operations and other receiver blocks or circuitry are well known to persons of ordinary skill in the art, and are not included.

Figure 3:
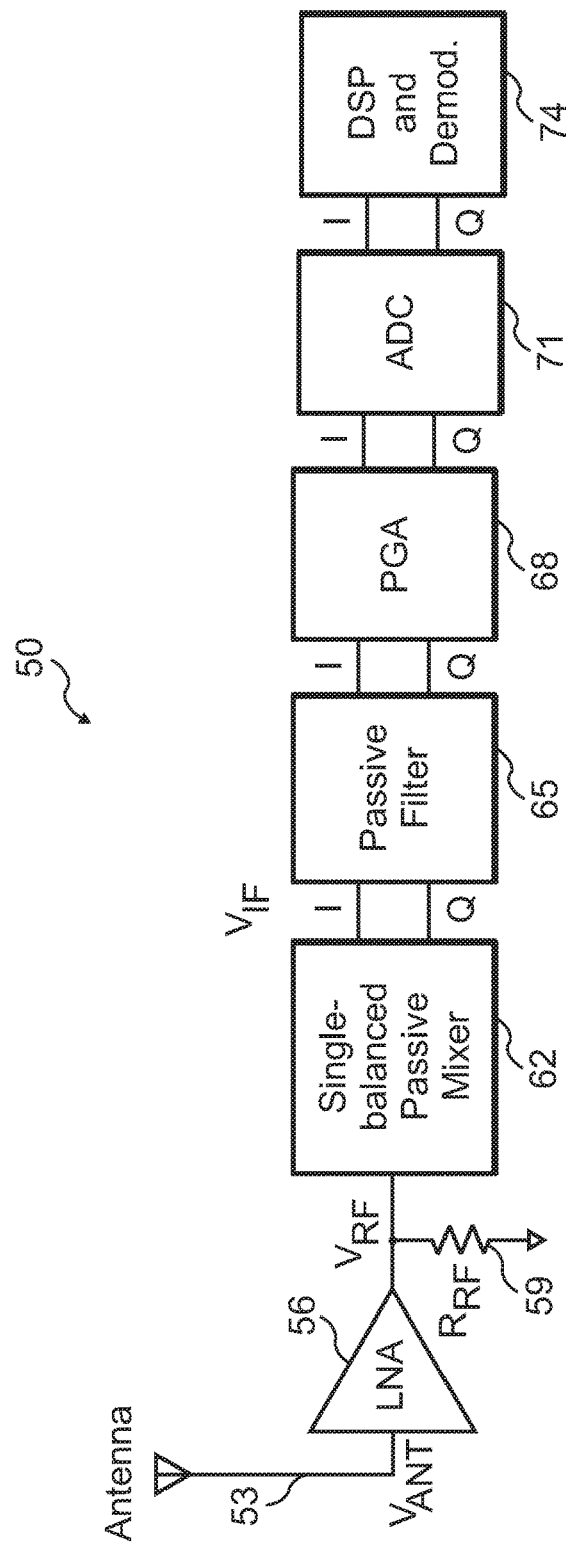
FIG. 3 shows a circuit arrangement for an RF receiver according to an exemplary embodiment.

FIG. 3 shows a circuit arrangement for an RF receiver 50 according to an exemplary embodiment. An antenna 53 receives RF signals, denoted by the voltage $V_{ANT}$. The RF signals feed LNA 56. LNA 56 performs low-noise amplification of the RF signals, and provides the amplified RF signals at its output. The voltage at the output of LNA 56 is denoted as $V_{RF}$.

The output of LNA 56 drives resistor 59 (labeled "$R_{RF}$") and the input of single-balanced passive mixer 62. Single-balanced passive mixer 62 mixes the RF signals at the output of LNA 56 with an LO signal (not shown) to generate IF signals. The IF signals at the output of single-balanced passive mixer 62 are complex. Thus, as shown in the figure, the IF signals have an in-phase (I) component and a quadrature (Q) component.

The output of single-balanced passive mixer 62 drives the input of passive filter 65. Passive filter 65 performs desired filtering of the IF signals, such as low-pass filtering. Note that, by virtue of its passive topology, passive filter 65 consumes less power and chip area than would active filters.

The output of passive filter 65 drives the input of PGA 68. PGA 68 amplifies the filtered IF signals, using a programmable gain. The gain of PGA 68 may be set or programmed or configured using a controller (not shown). The amplified signals are provided at the output of PGA 68.

The output of PGA 68 drives the input of analog to digital converter (ADC) 71. ADC 71 converts the analog output signals of PGA 68 to digital signals. ADC 71 may be implemented using a variety of techniques, as persons of ordinary skill in the art will understand. In exemplary embodiments, ADCs with relatively low power consumption may be used to reduce the overall power consumption of RF receiver 50.

The digital signals at the output of ADC 71 drive the input of DSP and demodulation (labeled "DSP and Demod") circuit 74. DSP and Demod. circuit 74 may perform a variety of functions (e.g., logic, arithmetic, etc.). For example, DSP and Demod. circuit 74 may demodulate the signals received from ADC 71, and may use the demodulated data in a program, routine, or algorithm (whether in software, firmware, hardware, or a combination) to perform desired control or data processing tasks.

In some embodiments, DSP and Demod. circuit 74 may perform control of other circuitry, sub-system, or systems (not shown). In some embodiments, DSP and Demod. circuit 74 may provide the data (after processing, as desired, for example, filtering) to another circuit (not shown), such as a transducer, display, etc. In some embodiments, DSP and Demod. circuit 74 may couple to, and operate together with, a microcontroller unit (MCU) (now shown).

In exemplary embodiments, RF receiver 50 uses an N-path filter architecture. This arrangement achieves the following objectives simultaneously. First, it eliminates the capacitive-input IF buffer at the N-path mixer output, thereby saving area and power. Second, it protects the IF stage from overload during AGC transients. Third, it creates a passive (zero power) pole at the mixer output. Fourth, it suppresses the noise of resistors in PGA 68, which enables design of relatively low power consumption and relatively low noise RF receivers.

Figure 4:
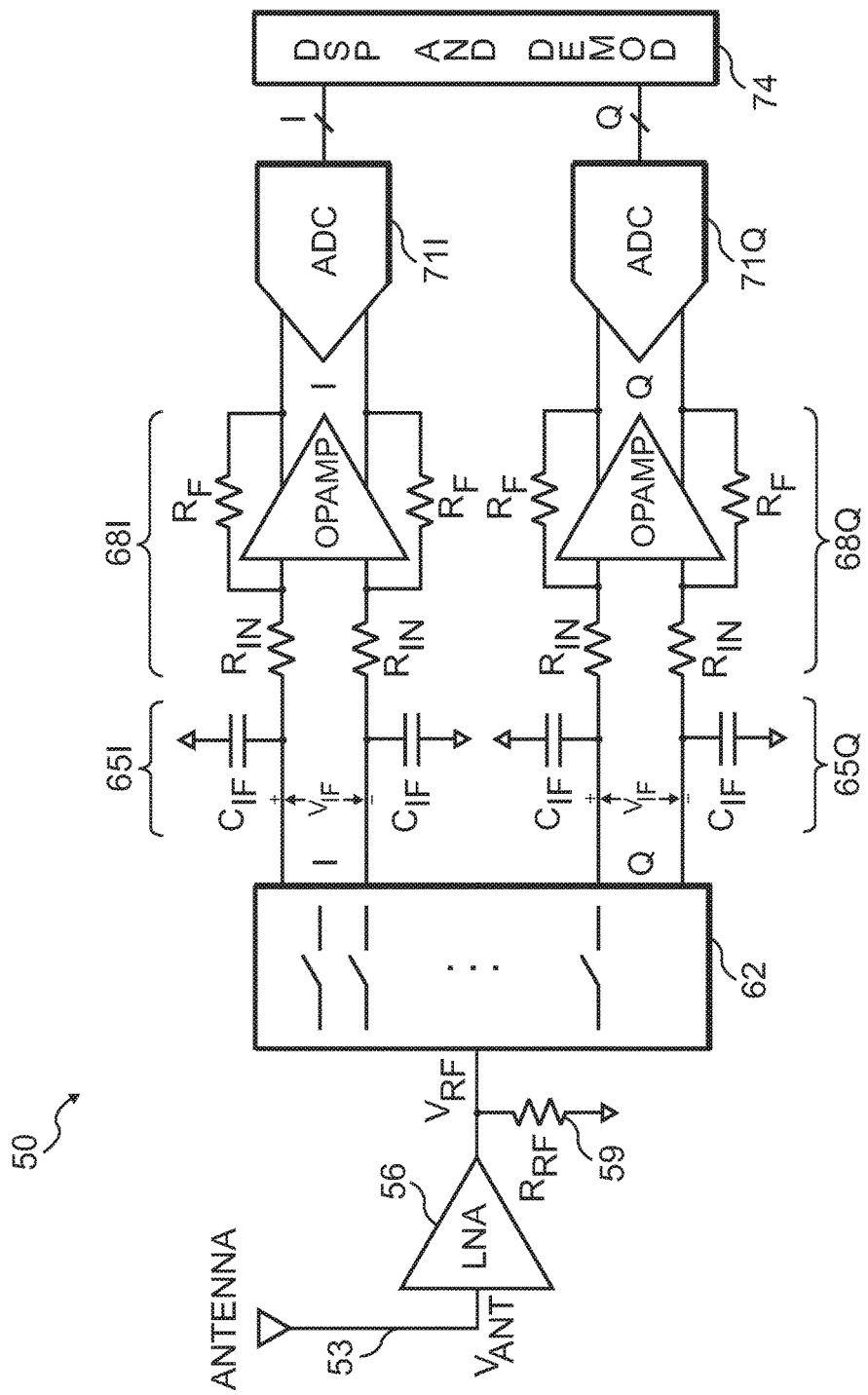
FIG. 4 depicts a circuit arrangement for an RF receiver according to another exemplary embodiment.

A variety of RF receiver architectures based on the block diagram in FIG. 3 are possible and contemplated. FIG. 4 depicts a circuit arrangement for an RF receiver 50 according to another exemplary embodiment.

An antenna 53 receives RF signals, denoted by the voltage $V_{ANT}$. The RF signals feed LNA 56. LNA 56 performs low-noise amplification of the RF signals, and provides the amplified RF signals at its output. The voltage at the output of LNA 56 is denoted as $V_{RF}$.

The output of LNA 56 drives resistor 59 (labeled "$R_{RF}$") and the input of single-balanced passive mixer 62. Single-balanced passive mixer 62 generally includes N switches, where N is a positive integer greater than or equal to two. In the case of complex (I-Q) mixers, single-balanced passive mixers have a minimum of 4 switches.

The output of single-balanced passive mixer 62 has I and Q components, as described above. The I and Q components drive two similar or identical circuits, each of which includes passive filter 65, PGA 68, and ADC 71. Thus, the I component of the output signal of single-balanced passive mixer 62 drives passive filter 65I, PGA 68I, and ADC 71I. Conversely, the Q component of the output signal of single-balanced passive mixer 62 drives passive filter 65Q, PGA 68Q, and ADC 71Q. Thus, passive filter 65 includes passive filters 65I and 65Q, PGA 68 includes PGAs 68I and 68Q, and so on.

In the embodiment shown, each of passive filters 65I and 65Q includes a pair of capacitors $C_{IF}$. Each of PGAs 68I and 68Q includes an op-amp with input resistors $R_AT$ and feedback resistors $R_F$. As shown in FIG. 4, the RF receiver omits the IF buffers, and the output of single-balanced passive mixer 62 drives the input of PGA 68.

The input resistor of PGA 68 ($R_{IN}$) is selected to have a large enough resistance so as to not significantly or substantially load the output of single-balanced passive mixer 62. Specifically, the PGA input resistor, $R_{IN}$, is relatively large compared to the RF source resistor, $R_{RF}$, for example, by a factor of 5 or 10.

The op-amps in PGA 68 are protected as follows. The maximum swing at $V_{IF}$ is limited by $V_{DD}$, the supply voltage of the system or RF receiver 50. Consequently, the largest current that can flow into the IF stage is proportional to $V_{DD}/R_{IN}$. As a result, the active circuits (e.g., op-amps) in PGA 68 sink or source a maximum current of $V_{DD}/R_{IN}$. This attribute makes a relatively large value of $R_{IN}$ desirable, however, large values of $R_{IN}$ result in increased thermal noise. RF receiver 50 suppresses the thermal noise, as described below in detail.

A passive pole is created by single-balanced passive mixer 62 due to the upconversion of the IF impedance at the LNA output at frequencies around the LO frequency. Consequently, the signal at the output of the LNA undergoes bandpass filtering. The conversion gain from $V_{ANT}$ to $V_{IF}$ is given by the following equation, $$\frac{V_{IF}(\Delta\omega)}{V_{ANT}(\omega_0 + \Delta\omega)} = \frac{G_m(\sqrt{2}/\pi)(4R_{RF} \| R_{IN})}{1 + j\Delta\omega(4R_{RF} \| R_{IN})C_{IF}}$$

where $\omega_o$ denotes the LO frequency, $\Delta\omega$ constitutes the IF frequency, and $G_m$ is the transconductance of the RF stage (e.g., LNA 56). The rest of the terms are defined in the figure.

The conversion gain for in-band frequencies is given by:

$G_m(\sqrt{2}/\pi)(4R_{RF}\|R_{IN})$

The 3-dB bandwidth (in Hz) of the passive pole is given by:

$1/(2\pi(4R_{RF}\|R_{IN})C_{IF})$

The above equations make evident that too small values of $R_{IN}$ will push the pole location to relatively high frequencies, where it does not effectively perform filtering (e.g., low-pass filtering). Further, relatively small values of $R_{IN}$ also decrease the in-band conversion gain. Thus, relatively large values of $R_{IN}$ are desirable from the viewpoint of conversion gain and filtering.

Relatively large values of $R_{IN}$, however, contribute to thermal noise. The thermal noise of the input resistance of PGA 68I or 68Q is suppressed using the unique properties of single-balanced passive mixer 62. More specifically, the voltage gain of the RF stage in FIG. 4 is given by the following equation:

$$\frac{V_{RF}(\omega_o + \Delta\omega)}{V_{ANT}(\omega_0 + \Delta\omega)} = \frac{G_m(\sqrt{2}/\pi^2)(4R_{RF} \| R_{IN})}{1 + j\Delta\omega(4R_{RF} \| R_{IN})C_{IF}}$$

From the above expressions, it can be seen that the conversion gain from $V_{RF}(\omega_o+\Delta\omega)$ to $V_{IF}(\Delta\omega)$ is $\pi/\sqrt{2}$ (about 6.9 dB). This gain helps reduce the noise of the PGA resistors $R_{IN}$ referred to $V_{ANT}$.

Double-balanced N-path mixers do not benefit from this passive gain and, hence, do not suppress the noise of the IF stage. Active mixers can provide gain, but at the cost of introducing increased power consumption and more thermal noise compared to passive mixers.

Single-balanced N-path mixers, such as single-balanced passive mixer 62, achieve further suppression of the thermal noise of $R_{IN}$ due to down-conversion and multiplication of the RF resistance $R_{RF}$. For example, for a 4-path mixer, the output impedance of the passive mixer is $4 \times R_{RF}$ at IF frequencies.

Figure 5:
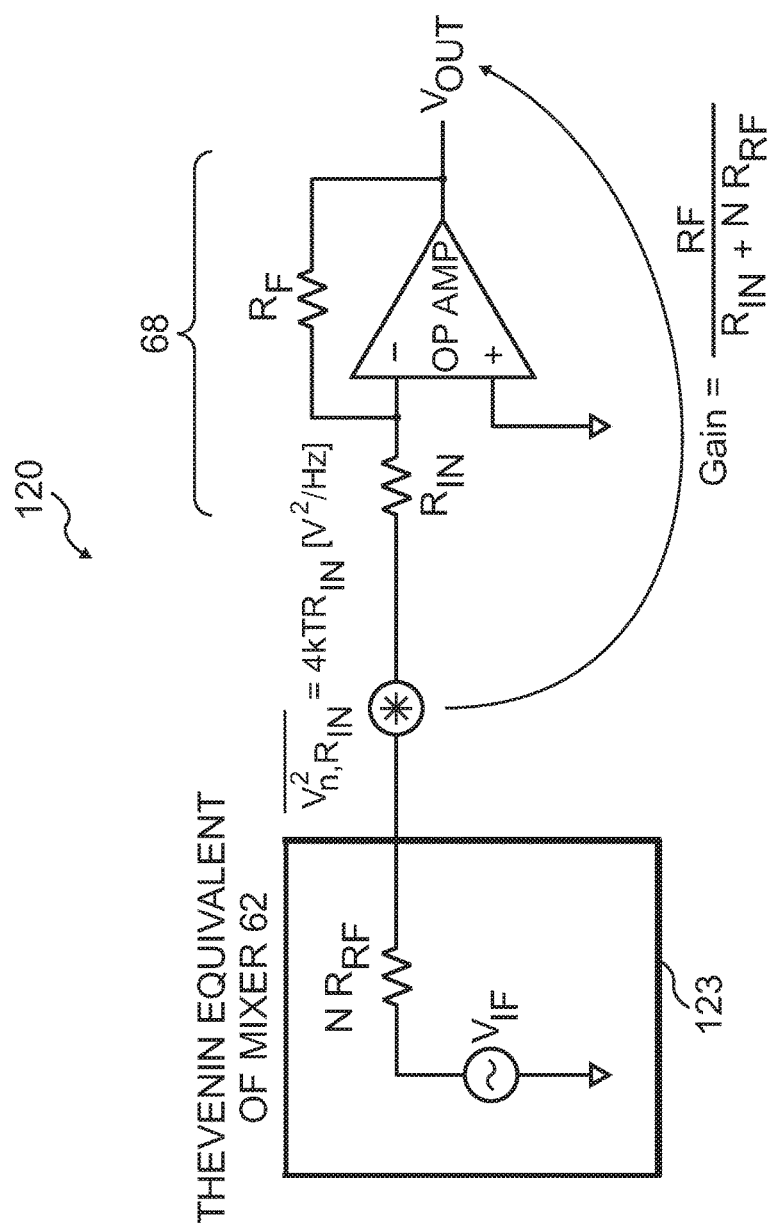
FIG. 5 illustrates a circuit arrangement for calculating noise contribution of the PGA in an RF receiver.

FIG. 5 illustrates a circuit arrangement 120 for calculating the noise transfer function of the PGA input resistor, $R_{IN}$, in the receiver shown in FIG. 4. The figure shows a Thevenin equivalent circuit 123 for single-balanced passive mixer 62, where N denotes the number of switches in the mixer. More specifically, the noise of resistor $R_{IN}$ experiences a source-dependent gain $R_F/(4R_{RF}+R_{IN})$ to the PGA output. In the case of a resistor-input PGA (e.g., PGA 68) driven by an IF buffer (FIG. 2) with low output impedance, the noise gain would simply be $R_F/R_{IN}$.

Since $4 \times R_{RF}$ can be made comparable to $R_{IN}$, doing so reduces the noise transfer function from $R_{IN}$ to the output of PGA 68 by the ratio $R_F/(4R_{RF}+R_{IN})$. If $4 \times R_{RF}$ is equal to $R_{IN}$, then a 6-dB reduction in the noise transfer function from $R_{IN}$ to the output of PGA 68 is obtained. Overall, the noise of the IF stage is suppressed 12.9-dB (the sum of 6.9 dB and 6 dB) in this example. As shown above, however, this number can vary depending on the particular resistance values used in a given implementation.

Figure 6:
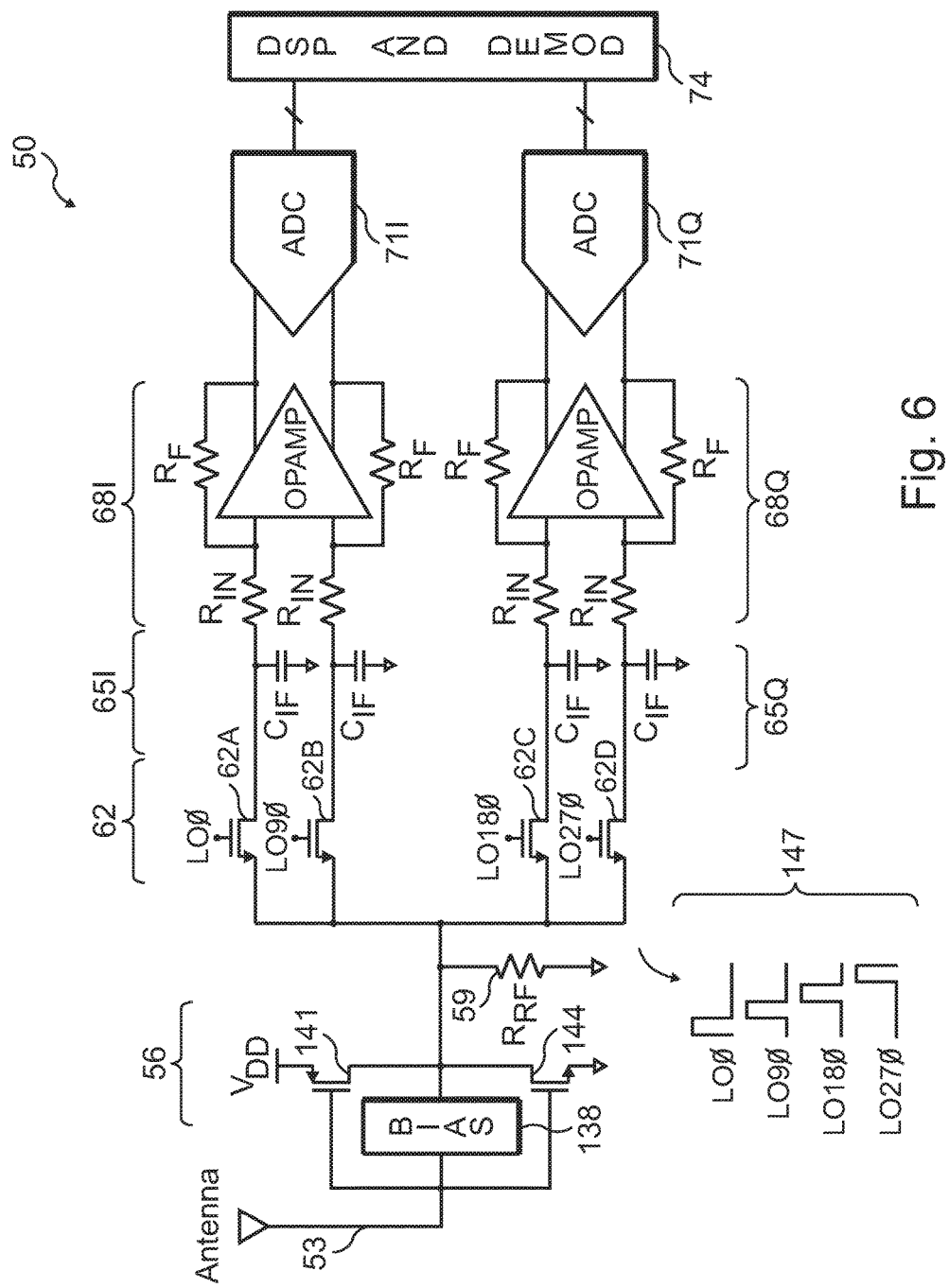
FIG. 6 depicts a circuit arrangement for an RF receiver according to another exemplary embodiment.

FIG. 6 depicts a circuit arrangement for an RF receiver according to another exemplary embodiment. In the embodiment shown, LNA 56 includes p-channel metal oxide semiconductor (MOS) transistor 141 coupled to n-channel MOS transistor 144. LNA 56 further includes bias circuit 138, coupled to transistor 141 and transistor 142. LNA 56 therefore constitutes a single-ended, common-source complementary MOS LNA.

The output of LNA 56 drives resistor 59 and also the input of single-balanced passive mixer 62. The passive mixer is driven with 4-phase 25% duty-cycle non-overlapping clock signals 147. As clock signals 147 are non-overlapping, at any given time, no more than one of MOS transistors 62A-62D is turned on.

Each of MOS transistors 62A-62D is coupled to a respective capacitor $C_{IF}$ in passive filter 65 (which includes passive filter 65I and passive filter 65Q). The capacitors $C_{IF}$ and the PGA input resistors $R_{IN}$ create a low-pass passive filter for each of the I and Q signal paths.

PGA 68 uses op-amps with CMOS push-pull output stages (not shown) to minimize or reduce quiescent current consumption. The input resistor of the PGA, $R_{IN}$, limits the amount of current that the PGA op-amps source or sink to a maximum of $V_{DD}/R_{IN}$. This attribute keeps the PGA input and output biased correctly during large RF overloads and subsequent AGC transients or gain pullbacks.

Although relatively large values of $R_{IN}$ would help create a passive pole of sufficiently low frequency and also limit PGA overload, the thermal noise of such resistor values can be relatively large. Single-balanced passive mixer 62 provides about 6.9 dB passive voltage gain, which helps suppress the thermal noise of the PGA input resistor, $R_{IN}$. (Note that a double-balanced passive mixer does not provide this passive gain.)

Further, the thermal noise of resistors $R_{IN}$ is suppressed by another 3 to 4 dB by the source resistance presented to the PGA by single-balanced passive mixer 62. In the embodiment shown, the source resistance is $4 \times R_{RF}$, where $R_{RF}$ denotes the resistance at the output of LNA 56, as described above.

Overall, the thermal noise of the PGA input resistor is suppressed 10 to 11 dB in the embodiment shown by single-balanced passive mixer 62. The noise suppression allows the use of relatively large values of $R_{IN}$ and results in corresponding relatively large power saving in LNA 56 and in the op-amps in PGA 68.

Figure 7:
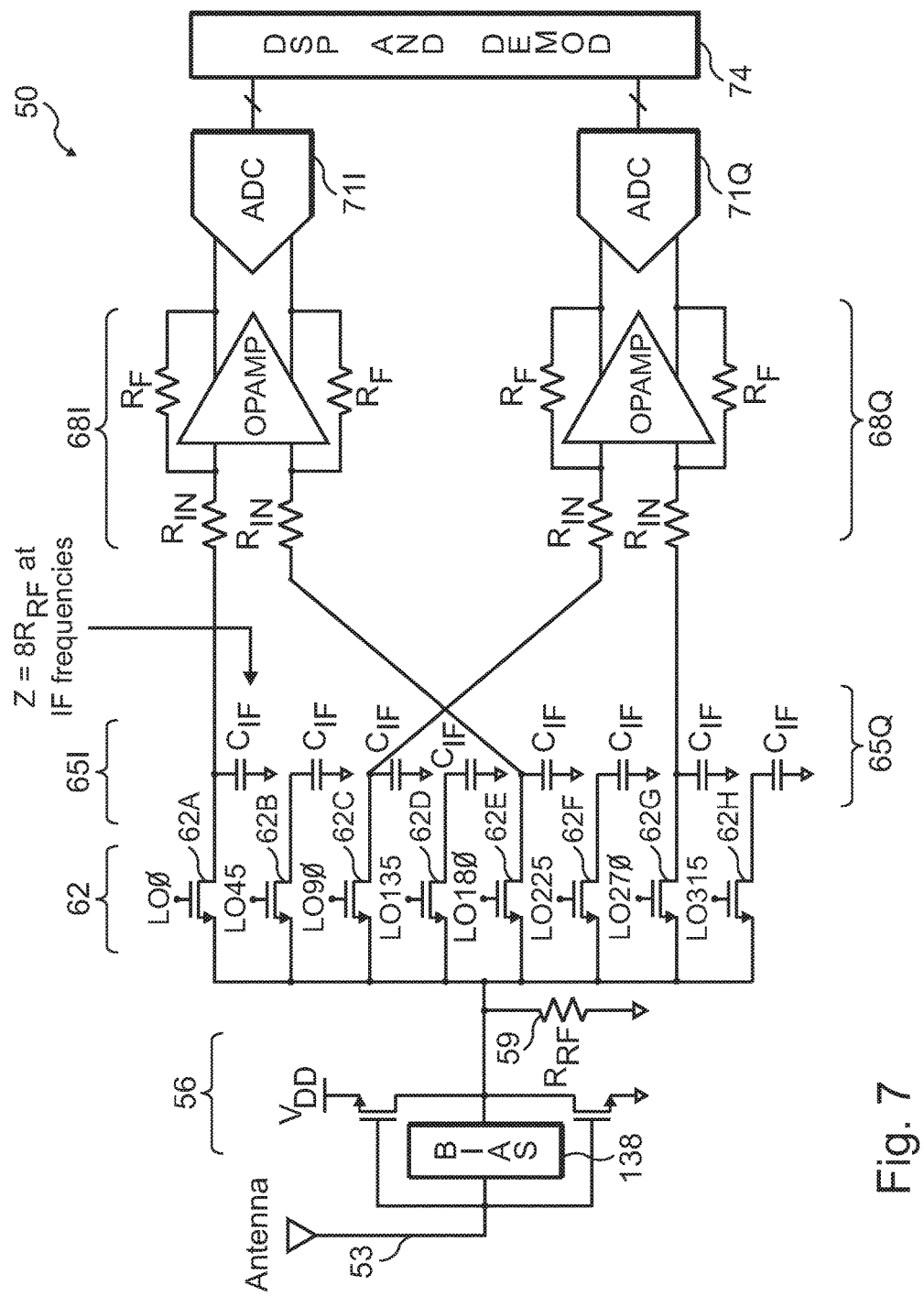
FIG. 7 illustrates a circuit arrangement for an RF receiver according to another exemplary embodiment.

FIG. 7 illustrates a circuit arrangement for an RF receiver 50 according to another exemplary embodiment. In the embodiment shown, the 4-phase, 25% duty cycle N-path mixer of FIG. 6 is replaced with an 8-phase, 12.5% duty cycle N-path mixer 62, which is driven with non-overlapping clocks. In other words, a set of 8 non-overlapping clock signals drives the respective gates of MOS transistors 62A-62H. A set of 8 $C_{IF}$ capacitors is coupled to a respective MOS transistors 62A-62H.

The gain from $V_{RF}(\omega_o + \Delta\omega)$ to $V_{IF}(\Delta\omega)$ in the embodiment in FIG. 7 is about 6.25 dB, as opposed to 6.9 dB for the 4-phase embodiment in FIG. 6. The embodiment in FIG. 7 incurs a relatively small (almost insignificant) drop in gain, but the down-converted RF impedance (shown as "Z") is now $8 \times R_{RF}$, compared to $4 \times R_{RF}$ for the 4-phase embodiment in FIG. 6.

As shown in FIG. 5, this attribute further reduces the gain experienced by the thermal noise of resistors $R_{IN}$ to the output of PGA 68. As demonstrated by the embodiment in FIG. 7, the number of phases in the single-balanced mixer 62 (the number of MOS transistors) can be changed (along with a corresponding change to the number and phase relation of the clock signals) to control the extent to which the receiver output sees or experiences a noise contribution from resistors $R_{IN}$.

Figure 8:
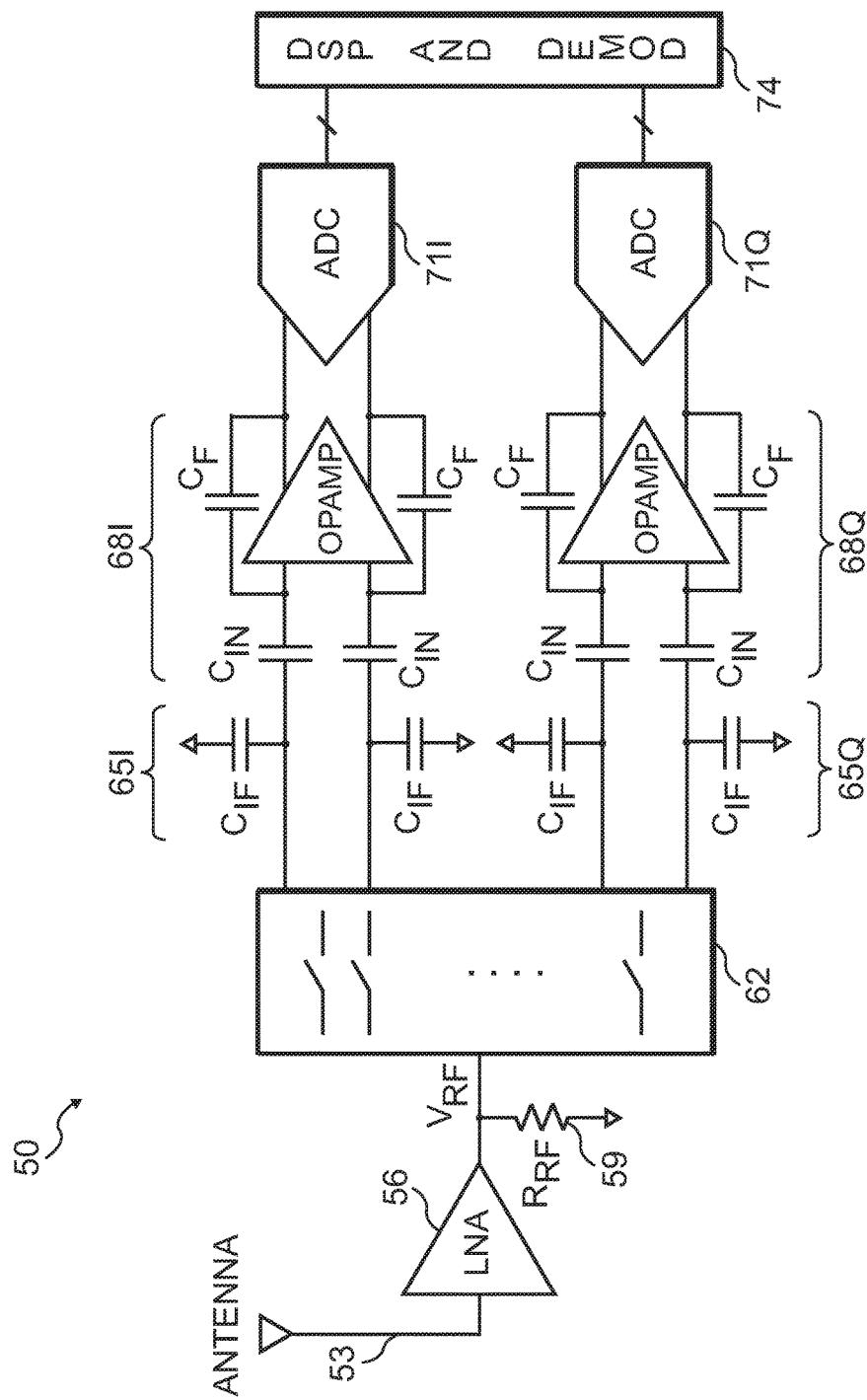
FIG. 8 shows a circuit arrangement for an RF receiver according to another exemplary embodiment.

FIG. 8 shows a circuit arrangement for an RF receiver 50 according to another exemplary embodiment. In this embodiment, the input and feedback resistors of PGA 68 ($R_{IN}$ and $R_F$) are replaced with capacitors $C_{IN}$ and $C_F$, respectively. The substitution eliminates the thermal noise contribution of resistors $R_{IN}$.

Input capacitors $C_{IN}$ of PGA 68 now play the role of the N-path filter capacitors due to the virtual ground nodes at the input of the PGA op-amps. The capacitance of capacitors $C_{IF}$ can still be used to adjust the total value of IF capacitance, as desired. Resistors with relatively large resistances can be used in parallel with corresponding capacitors $C_F$ to provide DC bias the inputs of the op-amps. Such resistors, however, make no substantial difference to the operation of single-balanced passive mixer 62 or PGA 68.

Note that the embodiments of RF receives shown in the figures constitute exemplary embodiments. Accordingly, a variety of other embodiments are possible and contemplated. Such embodiments may include other devices, components, etc. For example, although single-balanced mixer 62 is shown in some embodiments as using MOS transistors, other devices may be used. Generally, electronically controlled switches may be used. Similarly, LNA 56 may have other configurations or topologies, as desired.

Figure 9:
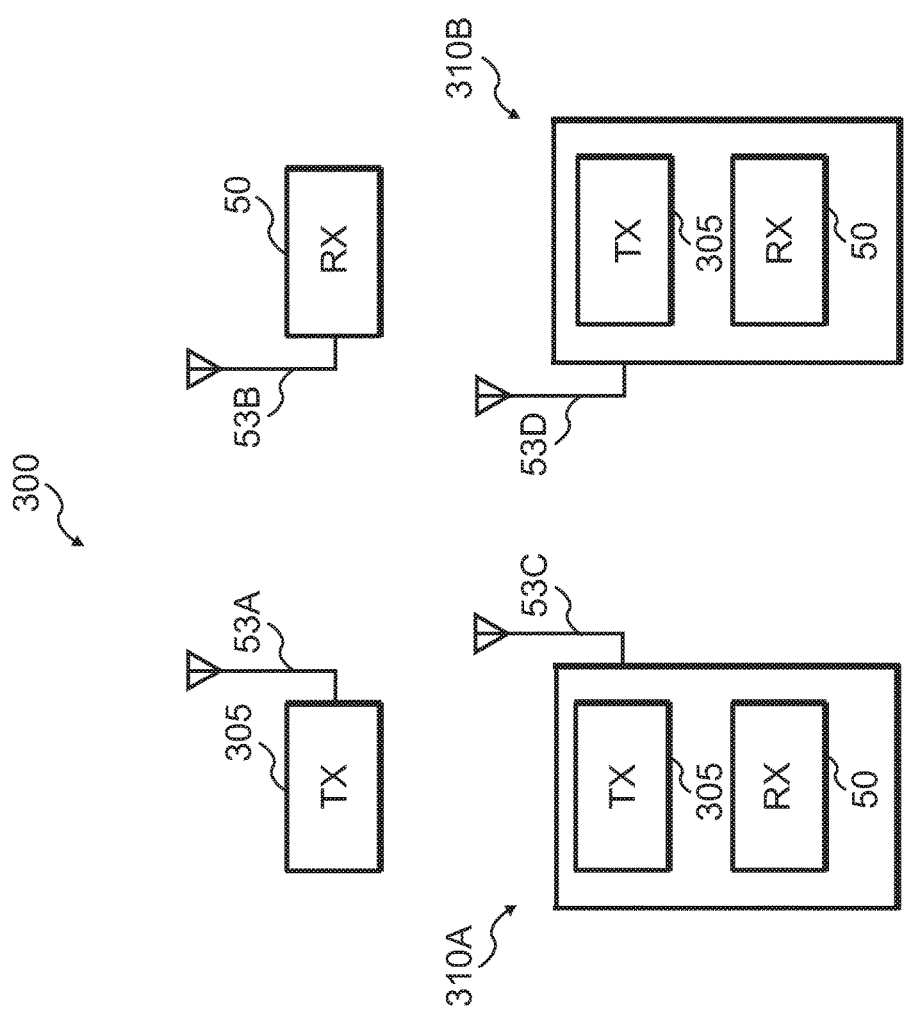
FIG. 9 illustrates a system for radio communication according to an exemplary embodiment.

One aspect of the disclosure relates to apparatus, including systems, that include RF receivers. RF receivers according to exemplary embodiments may be used in a variety of communication arrangements, systems, sub-systems, networks, etc., as desired. FIG. 9 shows a system 300 for radio communication according to an exemplary embodiment.

System 300 includes a transmitter 305, coupled to antenna 53A. Via antenna 53A, transmitter 305 transmits RF signals. The RF signals may be received by receiver 50, described above. In addition, or alternatively, transceiver 310A and/or transceiver 310B might receive (via receiver 50) the transmitted RF signals.

In addition to receive capability, transceiver 310A and transceiver 310B can also transmit RF signals. The transmitted RF signals might be received by receiver 50, either in the stand-alone receiver, or via the receiver circuitry of a transceiver in receive mode.

Other systems or sub-systems with varying configuration and/or capabilities are also contemplated and possible. For example, in some exemplary embodiments, two or more transceivers (e.g., transceiver 310A and transceiver 310B) might form a network, such as an ad-hoc or mesh network. As another example, in some exemplary embodiments, transceiver 310A and transceiver 310B might form part of a network, for example, in conjunction with transmitter 305, as desired.

Receivers according to exemplary embodiments may be combined with other circuitry. For example, the receiver and signal processing, logic, or computing circuitry may be integrated within an IC.

Figure 10:
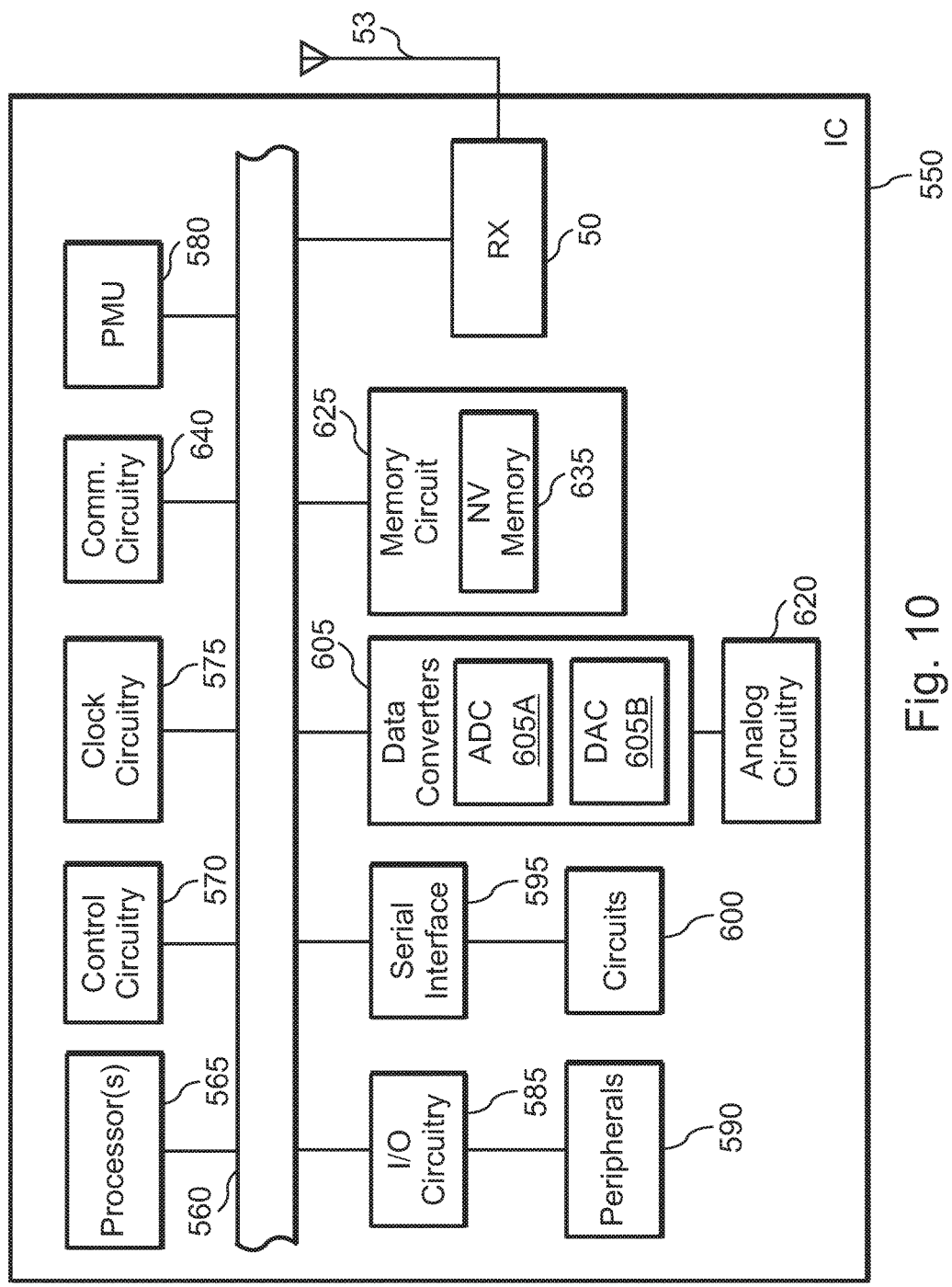
FIG. 10 depicts a circuit arrangement for an IC according to an exemplary embodiment.

FIG. 10 illustrates an IC 550, for example, a microcontroller unit (MCU), that combines a receiver with other circuit blocks according to an exemplary embodiment. IC 550 includes a number of blocks (e.g., processor(s) 565, data converter 605, I/O circuitry 585, etc.) that communicate with one another using a link 560. In exemplary embodiments, link 560 may constitute a coupling mechanism, such as a bus, a set of conductors or semiconductors for communicating information, such as data, commands, status information, and the like.

IC 550 may include link 560 coupled to one or more processors 565, clock circuitry 575, and power management circuitry 580. In some embodiments, processor(s) 565 may include circuitry or blocks for providing computing functions, such as central-processing units (CPUs), arithmetic-logic units (ALUs), and the like. In some embodiments, in addition, or as an alternative, processor(s) 565 may include one or more DSPs. The DSPs may provide a variety of signal processing functions, such as arithmetic functions, filtering, delay blocks, and the like, as desired. In some embodiments, functionality of parts of receiver 50, such as those described above, may be implemented or realized using some of the circuitry in processor(s) 565, as desired.

Referring again to FIG. 10, clock circuitry 575 may generate one or more clock signals that facilitate or control the timing of operations of one or more blocks in IC 550. Clock circuitry 575 may also control the timing of operations that use link 560. In some embodiments, clock circuitry 575 may provide one or more clock signals via link 560 to other blocks in IC 550.

In some embodiments, power management circuitry 580 may reduce an apparatus's (e.g., IC 550) clock speed, turn off the clock, reduce power, turn off power, or any combination of the foregoing with respect to part of a circuit or all components of a circuit. Further, power management circuitry 580 may turn on a clock, increase a clock rate, turn on power, increase power, or any combination of the foregoing in response to a transition from an inactive state to an active state (such as when processor(s) 565 make a transition from a low-power or idle or sleep state to a normal operating state).

Link 560 may couple to one or more circuits 600 through serial interface 595. Through serial interface 595, one or more circuits coupled to link 560 may communicate with circuits 600. Circuits 600 may communicate using one or more serial protocols, e.g., SMBUS, I$^2$C, SPI, and the like, as a person of ordinary skill in the art will understand.

Link 560 may couple to one or more peripherals 590 through I/O circuitry 585. Through I/O circuitry 585, one or more peripherals 590 may couple to link 560 and may therefore communicate with other blocks coupled to link 560, e.g., processor(s) 365, memory circuit 625, etc.

In exemplary embodiments, peripherals 590 may include a variety of circuitry, blocks, and the like. Examples include I/O devices (keypads, keyboards, speakers, display devices, storage devices, timers, etc.). Note that in some embodiments, some peripherals 590 may be external to IC 550. Examples include keypads, speakers, and the like. In some embodiments, with respect to some peripherals, I/O circuitry 585 may be bypassed. In such embodiments, some peripherals 590 may couple to and communicate with link 560 without using I/O circuitry 585. Note that in some embodiments, such peripherals may be external to IC 550, as described above.

Link 560 may couple to analog circuitry 620 via data converter 605. Data converter 605 may include one or more ADCs 605A and/or one or more DACs 605B. The ADC(s) 605A receive analog signal(s) from analog circuitry 620, and convert the analog signal(s) to a digital format, which they communicate to one or more blocks coupled to link 560. Conversely, DAC(s) 605B receive one or more digital signals from one or more blocks coupled to link 560, and convert the digital signal(s) to an analog format. The analog signal(s) may be provided to circuitry within (e.g., analog circuitry 620) or circuitry external to IC 550, as desired. Analog circuitry 620 may include a wide variety of circuitry that provides and/or receives analog signals. Examples include sensors, transducers, and the like, as person of ordinary skill in the art will understand. In some embodiments, analog circuitry 620 may communicate with circuitry external to IC 550 to form more complex systems, subsystems, control blocks, and information processing blocks, as desired.

Control circuitry 570 couples to link 560. Thus, control circuitry 570 may communicate with and/or control the operation of various blocks coupled to link 560. In addition or as an alternative, control circuitry 570 may facilitate communication or cooperation between various blocks coupled to link 560. In some embodiments, the functionality or circuitry of control circuits in receiver 50 (e.g., to control the gains of the PGAs, to control DSP and/or demodulation circuitry, etc.) may be combined with or included with the functionality or circuitry of control circuitry 570, as desired.

Referring again to FIG. 10, in some embodiments, control circuitry 570 may initiate or respond to a reset operation. The reset operation may cause a reset of one or more blocks coupled to link 560, of IC 550, etc., as person of ordinary skill in the art will understand. For example, control circuitry 570 may cause receiver 50 to reset to an initial state. In exemplary embodiments, control circuitry 570 may include a variety of types and blocks of circuitry. In some embodiments, control circuitry 570 may include logic circuitry, finite state machines (FSMs), or other circuitry to perform a variety of operations, such as the operations described above.

Communication circuitry 640 couples to link 560 and also to circuitry or blocks (not shown) external to IC 550. Through communication circuitry 640, various blocks coupled to link 560 (or IC 550, generally) can communicate with the external circuitry or blocks (not shown) via one or more communication protocols. Examples include universal serial bus (USB), Ethernet, and the like. In exemplary embodiments, other communication protocols may be used, depending on factors such as specifications for a given application, as person of ordinary skill in the art will understand.

As noted, memory circuit 625 couples to link 560. Consequently, memory circuit 625 may communicate with one or more blocks coupled to link 560, such as processor(s) 565, control circuitry 570, I/O circuitry 585, etc. In the embodiment shown, memory circuit 625 includes memory array 635. Memory circuit 625 may perform memory read or write operations via link 560.

In exemplary embodiments, memory circuit 625 may support various protocols, such as double data rate (DDR), DDR2, DDR3, and the like, as desired. In some embodiments, the memory read and/or write operations involve the use of one or more blocks in IC 550, such as processor(s) 565. In some embodiments, memory circuit 625 may include DMA circuitry (not shown) that allows increased performance of memory operations in some situations. More specifically, in such embodiments, the DMA circuitry provides a mechanism for performing memory read and write operations directly between the source or destination of the data and memory circuit 625, rather than through blocks such as processor(s) 565.

Memory array 635 may include a variety of memory circuits or blocks. In the embodiment shown, memory array 635 includes non-volatile (NV) memory, however, in some embodiments, memory array 635 may include volatile memory, or both non-volatile memory and volatile memory, as desired. In some embodiments, memory array 635 may be used for storing information related to performance or configuration of one or more blocks in IC 550. For example, memory array 635 may store configuration information related to various operations of receiver 50 and/or to initial or ongoing configuration or control of receiver 50, as desired.

As described above in detail, receiver 50 receives RF signals via antenna 53, and processes those signals. The resulting data signals are provided to one or more blocks of circuitry in IC 550 via link 560. Furthermore, various blocks of circuitry in IC 550 may be used to process the received data and to generate additional data or signals, which may be used to control other circuitry, etc.

In some embodiments, a transmitter may be included in IC 550. In such configurations, the transmitter may transmit information generated or processed in IC 550, such as information derived from, based on, or related to data received by receiver 50. Thus, sophisticated control and communication subsystems, blocks, circuits, or systems for processing information and/or control may be implemented.

Figure 11:
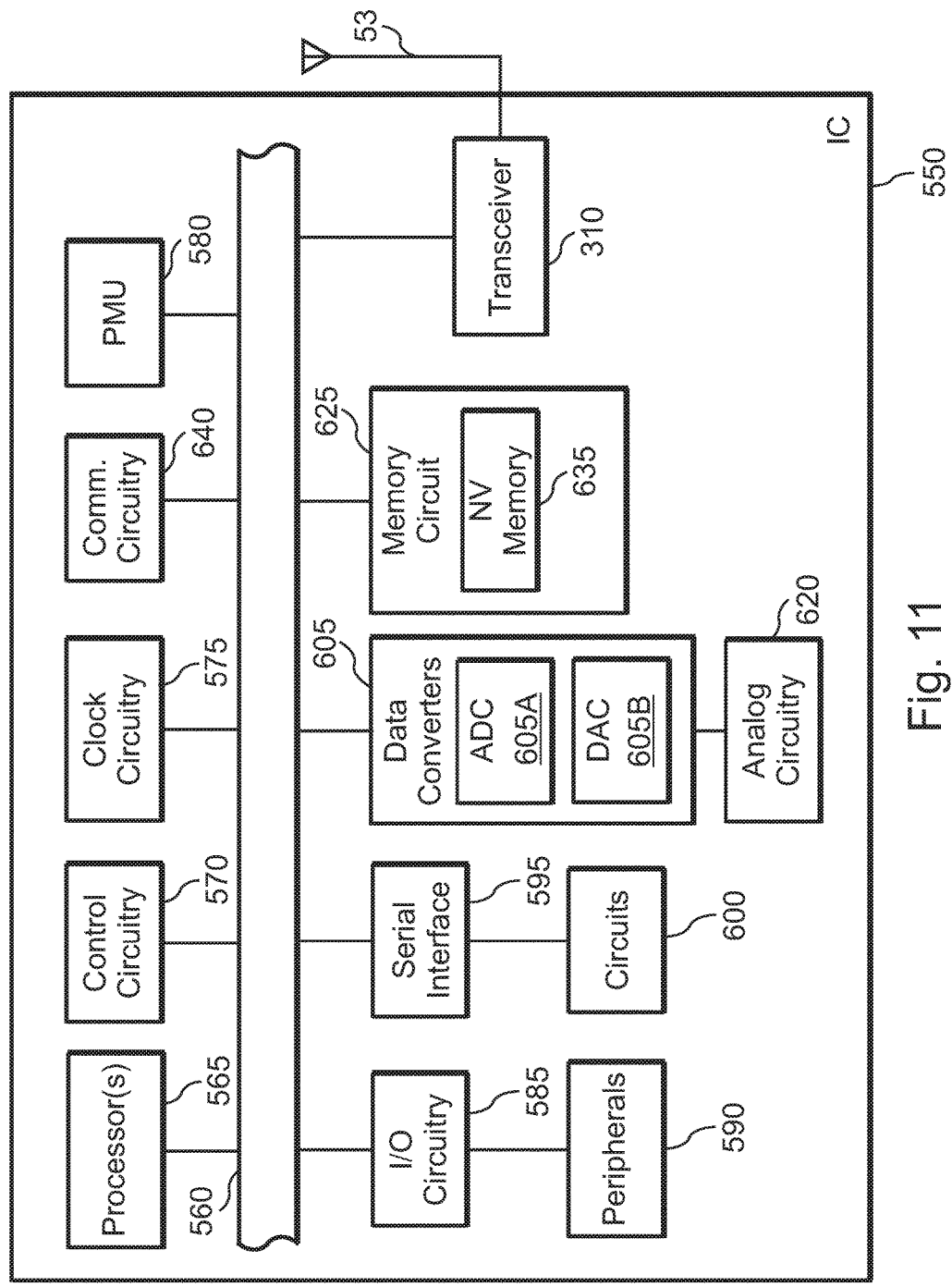
FIG. 11 shows a circuit arrangement for an IC according to another exemplary embodiment.

FIG. 11 shows a circuit arrangement for an IC 550 according to another exemplary embodiment. Unlike IC 550 in FIG. 10, IC 550 in FIG. 11 has both RF receive and transmit capability. More specifically, IC 550 in FIG. 11 includes transceiver 310, although more than one transceiver may be used, as desired.

Transceiver(s) 310, which include respective RF receiver (s) 50, transmit and/or receive RF signals via antenna 53, as described above. Transceiver(s) 310 are coupled to link 560, as described above with respect to receiver 50, to provide communication and cooperation with various blocks in IC 550, as desired, and as described above.

Various circuits and blocks described above and used in exemplary embodiments may be implemented in a variety of ways and using a variety of circuit elements or blocks. For example, some of the circuitry or blocks in FIGS. 1-4 and 6-11 may generally be implemented using digital circuitry. The digital circuitry may include circuit elements or blocks such as gates, digital multiplexers (MUXs), latches, flip-flops, registers, finite state machines (FSMs), processors, programmable logic (e.g., field programmable gate arrays (FPGAs) or other types of programmable logic), arithmetic-logic units (ALUs), standard cells, custom cells, etc., as desired, and as persons of ordinary skill in the art will understand. In addition, analog circuitry or mixed-signal circuitry or both may be included, for instance, power converters, discrete devices (transistors, capacitors, resistors, inductors, diodes, etc.), and the like, as desired. The analog circuitry may include bias circuits, decoupling circuits, coupling circuits, supply circuits, current mirrors, current and/or voltage sources, filters, amplifiers, converters, signal processing circuits (e.g., multipliers), detectors, transducers, discrete components (transistors, diodes, resistors, capacitors, inductors), analog MUXs and the like, as desired, and as persons of ordinary skill in the art will understand. The mixed-signal circuitry may include analog to digital converters (ADCs), digital to analog converters (DACs), etc.) in addition to analog circuitry and digital circuitry, as described above, and as persons of ordinary skill in the art will understand. The choice of circuitry for a given implementation depends on a variety of factors, as persons of ordinary skill in the art will understand. Such factors include design specifications, performance specifications, cost, IC or device area, available technology, such as semiconductor fabrication technology), target markets, target end-users, etc.

Various analog circuits and blocks described above and used in exemplary embodiments may be implemented in a variety of ways and using a variety of circuit elements or blocks. For example, single-balanced passive mixer 62, passive filter 65, and PGA 68 may generally be implemented using analog circuitry. The analog circuitry may include bias circuits, decoupling circuits, coupling circuits, supply circuits, current mirrors, current and/or voltage sources, filters, amplifiers, converters, signal processing circuits (e.g., multipliers), sensors or detectors, transducers, discrete components (transistors, diodes, resistors, capacitors, inductors), analog MUXs, and the like, as desired, and as persons of ordinary skill in the art will understand. In addition, digital circuitry or mixed-signal circuitry or both may be included. The digital circuitry may include circuit elements or blocks such as gates, digital multiplexers (MUXs), latches, flip-flops, registers, finite state machines (FSMs), processors, programmable logic (e.g., field programmable gate arrays (FPGAs) or other types of programmable logic), arithmetic-logic units (ALUs), standard cells, custom cells, etc., as desired, and as persons of ordinary skill in the art will understand. The mixed-signal circuitry may include analog to digital converters (ADCs), digital to analog converters (DACs), etc.) in addition to analog circuitry and digital circuitry, as described above, and as persons of ordinary skill in the art will understand. The choice of circuitry for a given implementation depends on a variety of factors, as persons of ordinary skill in the art will understand. Such factors include design specifications, performance specifications, cost, IC or device area, available technology, such as semiconductor fabrication technology), target markets, target end-users, etc.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to the embodiments in the disclosure will be apparent to persons of ordinary skill in the art. Accordingly, the disclosure teaches those skilled in the art the manner of carrying out the disclosed concepts according to exemplary embodiments, and is to be construed as illustrative only. Where applicable, the figures might or might not be drawn to scale, as persons of ordinary skill in the art will understand.

The particular forms and embodiments shown and described constitute merely exemplary embodiments. Persons skilled in the art may make various changes in the shape, size and arrangement of parts without departing from the scope of the disclosure. For example, persons skilled in the art may substitute equivalent elements for the elements illustrated and described. Moreover, persons skilled in the art may use certain features of the disclosed concepts independently of the use of other features, without departing from the scope of the disclosure.

The invention claimed is:

1. An apparatus, comprising:
   a radio-frequency (RF) receiver, comprising:
   a single-balanced passive mixer driven by the output of a low noise amplifier (LNA);

a passive filter driven by an output of the single-balanced passive mixer; and a programmable gain amplifier (PGA) having an input resistance that generates noise, the PGA driven by an output of the passive filter, wherein the noise generated by the input resistance of the PGA is suppressed.

2. The apparatus according to claim 1, further comprising a resistor coupled to the output of the LNA.

3. The apparatus according to claim 1, wherein use of the passive filter reduces a power consumption of the RF receiver.

4. The apparatus according to claim 1, wherein a transfer function of the RF receiver has a passive pole created by the single-balanced passive mixer.

5. The apparatus according to claim 1, wherein the passive filter is coupled to the PGA without intervening buffers.

6. The apparatus according to claim 5, wherein the PGA is protected from overload during RF signal transients.

7. The apparatus according to claim 1, wherein the single-balanced passive mixer comprises a plurality of switches driven by a corresponding plurality of non-overlapping clock signals.

8. The apparatus according to claim 1, wherein the PGA comprises at least one input resistor and at least one feedback resistor coupled to an operational amplifier (op-amp).

9. The apparatus according to claim 1, wherein the PGA comprises at least one input capacitor and at least one feedback capacitor coupled to an operational amplifier (op-amp).

10. An apparatus, comprising:
a radio-frequency (RF) receiver, comprising:
a low noise amplifier (LNA) driving a resistor coupled to an output of the LNA;
a single-balanced passive mixer driven by the output of the LNA;
a passive filter driven by an output of the single-balanced passive mixer; and
a programmable gain amplifier (PGA) having an input resistance that generates noise, the PGA driven by an output of the passive filter, wherein the noise generated by the input resistance of the PGA is suppressed by the resistor coupled to the output of the LNA and by operation of the single-balanced passive mixer.

11. The apparatus according to claim 10, wherein an output signal of the single-balanced passive mixer comprises a first complex signal, an output signal of the passive filter comprises a second complex signal, and an output signal of the PGA comprises a third complex signal.

12. The apparatus according to claim 10, wherein the single-balanced passive mixer comprises a plurality of transistors driven by a corresponding plurality of non-overlapping clock signals.

13. The apparatus according to claim 10, wherein the PGA comprises at least one input resistor and at least one feedback resistor coupled to a operational amplifier (op-amp).

14. The apparatus according to claim 10, wherein the PGA comprises at least one input capacitor and at least one feedback capacitor coupled to an operational amplifier (op-amp).

15. A method of processing signals in a radio-frequency (RF) receiver, the method comprising:
mixing, by using a single-balanced passive mixer driven by an output of a low noise amplifier (LNA) with a local oscillator (LO) signal to generate an intermediate frequency (IF) signal;
using a passive filter to filter the IF signal to generate a filtered signal;
amplifying the filtered signal, using a programmable gain amplifier (PGA) having an input resistance that generates noise, wherein the noise generated by the input resistance of the PGA is suppressed.

16. The method according to claim 15, further comprising shunting to ground via a resistor the output of the LNA.

17. The method according to claim 15, wherein using a passive filter to filter the IF signal to generate a filtered signal reduces a power consumption of the RF receiver.

18. The method according to claim 15, wherein a transfer function of the RF receiver has a passive pole created by the single-balanced passive mixer.

19. The method according to claim 15, wherein using a passive filter to filter the IF signal to generate a filtered signal and amplifying the filtered signal are performed without intervening buffers.

20. The method according to claim 15, wherein the PGA is protected from overload during RF signal transients.

* * * * *